(12) United States Patent
Parris et al.

(10) Patent No.: US 7,586,355 B2
(45) Date of Patent: Sep. 8, 2009

(54) LOW SKEW CLOCK DISTRIBUTION TREE

(75) Inventors: Michael C. Parris, Colorado Springs, CO (US); Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 84 days.

(21) Appl. No.: 11/776,371

(22) Filed: Jul. 11, 2007

(65) Prior Publication Data

US 2009/0015311 A1    Jan. 15, 2009

(51) Int. Cl.
*H03K 3/84* (2006.01)

(52) U.S. Cl. .................. 327/296; 327/297; 327/565; 438/596

(58) Field of Classification Search ............... None
See application file for complete search history.

(56) References Cited

U.S. PATENT DOCUMENTS

| | | | | |
|---|---|---|---|---|
| 5,043,596 A | * | 8/1991 | Masuda et al. | 327/297 |
| 5,990,719 A | * | 11/1999 | Dai et al. | 327/244 |
| 6,384,659 B2 | * | 5/2002 | Inohara | 327/295 |
| 6,630,855 B2 | * | 10/2003 | Fayneh et al. | 327/295 |

* cited by examiner

*Primary Examiner*—An T Luu
(74) *Attorney, Agent, or Firm*—Peter J. Meza; William J. Kubida; Hogan & Hartson LLP

(57) ABSTRACT

A clock distribution tree for an integrated circuit memory includes a set of data drivers, a corresponding set of input buffers coupled to the data drivers, a first clock distribution tree coupled to the data drivers, and a second clock distribution tree coupled to the input buffers, wherein the first and second clock distribution tree are substantially matched and mirrored distribution trees. The line width of the first clock distribution tree is substantially the same as the line width of the second clock distribution tree. The line spacing of the first clock distribution tree is substantially the same as the line spacing of the second clock distribution tree. Numerous topologies for the first and second clock distribution trees can be accommodated, as long as they are matched and mirrored. Valid times for the integrated circuit memory are maximized and data and clock skew is minimized.

20 Claims, 7 Drawing Sheets

LOW SKEW CLOCK DISTRIBUTION TREE

BACKGROUND OF THE INVENTION

The present invention is related to integrated circuit memories, and, more particularly, to a clock distribution tree for minimizing data skew between data drivers and associated input buffers in the memory.

Capture windows for inputs and outputs on today's high speed memories are becoming smaller. Input set up times (tS) and hold times (tH) are reduced as clock frequencies increase. Clock and signal skew are becoming larger as chip sizes increase. Because of these two trends, higher speed systems and larger chip size or RAM macro size, the actual valid time is being reduced for inputs and outputs to RAM circuit blocks.

Typical clock distribution trees 100 are shown in FIGS. 1(a)-1(d). There are many different ways to distribute or route a clock or control signal around a silicon integrated circuit. These many different ways of routing have different skew values or time differences between the closest (fastest) location and the furthest (slowest) location. The signal propagation time or skew depends on the length that the line needs to travel, the width of the line, the space of the line, the number of tree branches if any, and the transistor load on the line. FIG. 1(a) shows a clock distribution tree wherein inverters I30 and I31 are used to drive a first portion of a clock bus, and inverters I34 and I35 are used to drive a second portion of a clock bus. In turn, inverters I30 and I35 are driven by inverters I36 and I37. FIG. 1(b) shows a clock distribution tree wherein inverters I51 and I52 are used to drive the entire clock bus. FIG. 1(c) shows a clock distribution tree wherein a single inverter I41 is used to drive a first portion of a clock bus, and another single inverter I40 is used to drive a second portion of a clock bus. In turn, inverters I41 and I40 are driven by inverter I39. FIG. 1(d) shows a single inverter I56 for driving a first portion of a clock bus, a single inverter I55 for driving a second portion of a clock bus, a single inverter I54 for driving a third portion of a clock bus, and a single inverter I53 for driving a fourth portion of a clock bus. In turn, inverters I56 and I55 are driven by inverter I46. Inverters I53 and I54 are driven by inverter I45. Inverters I45 and I46 are finally driven by inverters I57 and I44.

A clock distribution tree is shown for a portion of an integrated circuit memory 200 in FIG. 2. Integrated circuit memory 200 includes input buffers 202 designated 0 through 7. Each input buffer has a data input, a data output (not shown), and a clock input. Integrated circuit memory 200 also includes data drivers 204 designated 0 through 7, corresponding to each of the input buffers. Only the clock input and the data output of the data drivers 204 is shown in FIG. 2. The data drivers 204 are clocked by a first clock distribution tree originating from signal ACLK including inverters I53-I57 and I44-I46. Inverter I56 clocks data drivers 6 and 7, inverter I55 clocks data drivers 4 and 5, inverter I54 clocks data drivers 2 and 3, and inverter I53 clocks data drivers 0 and 1. In turn, inverters I55 and I56 are driven by inverter I46, and inverters I53 and I54 are driven by inverter I45. Inverters I45 and I46 are driven by inverters I44 and I57. The widths and spacings of the ACLK signal routing before and after these clock tree inverters are noted as Iµ, Jµ, Gµ, . . . Eµ, indicating I, J, G and E microns. For example, the width of the line running from inverter I53 to data driver 0 is Iµ. The clock tree is balanced and symmetrical in that the line width from inverter I54 to data driver 3 is also Iµ. The spacing of each of these lines to adjacent lines is also the same as Jµ. The input buffers 202 are clocked by a second clock distribution tree coming from signal BCLK including inverters I30-I31 and I34-I37. Inverters I30 and I31 clocks data drivers 4-7, and inverters I34 and I35 clocks data drivers 0-3. In turn, inverters I30 and I35 are driven by inverters I36 and I37. The widths and spacings of the BCLK signal tree are noted by the labels Aµ, Bµ, Cµ, and Dµ, indicating A, B, C, and D microns.

It is important to note in FIG. 2 that the two clock distribution trees are not matched. The topology of the clock distribution trees is different for clocking the input buffers 202 and the data drivers 204. Further, the widths and spacings associated with the various clock busses and clock bus segments is also unmatched. This leads to clock and data skew and loss of performance.

On prior art circuits even if good engineering practices are used, the valid data window can be reduced depending on the particular clock tree used. The block diagram of FIG. 2 shows the clock tree used to control input buffers 202 designated 0 through 7 on an embedded RAM BLOCK circuit 206. The latching of input buffers 1 and 2 are fastest and of the input buffers 4 and 7 are the slowest. The low skew clock tree chosen to provide data for these input buffers offers almost zero skew. In other words, the ACLK tree distribution design contains almost no skew or timing difference from enabling data drivers 204 in all eight locations, 0 through 7. So even though this is a better design to reduce skew, it is inferior in maximizing the valid data window for these buffers. Buffers 1 and 2 will have reduced set up times and buffers 4 and 7 will have reduced hold times.

What is desired, therefore, is a clock distribution tree and method that maximizes valid times for inputs and outputs to RAM circuit blocks in an integrated circuit memory.

SUMMARY OF THE INVENTION

According to the present invention, a clock distribution tree for an integrated circuit memory includes a plurality of data drivers, a plurality of input buffers coupled to the plurality of data drivers, a first clock distribution tree coupled to the plurality of data drivers, and a second clock distribution tree coupled to the plurality of input buffers, wherein the first and second clock distribution tree are substantially matched and mirrored distribution trees. The line width of the first clock distribution tree is substantially the same as the line width of the second clock distribution tree. The line spacing of the first clock distribution tree is substantially the same as the line spacing of the second clock distribution tree. Numerous topologies for the first and second clock distribution trees can be accommodated, as long as they are matched and mirrored. According to the present invention, valid times are maximized and data and clock skew is minimized.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF THE INVENTION

Figure 1:
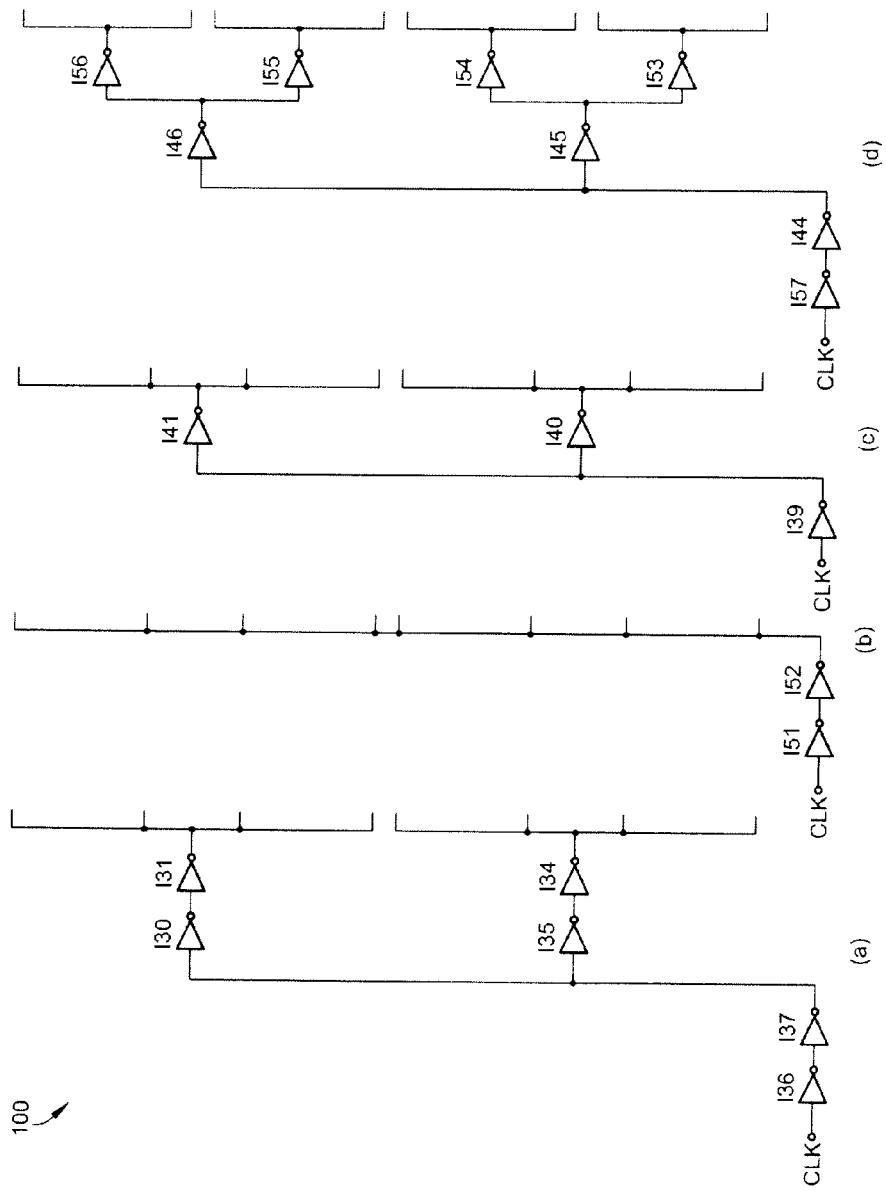
FIG. 1 is a schematic diagram of prior art clock distribution trees.
Figure 2:
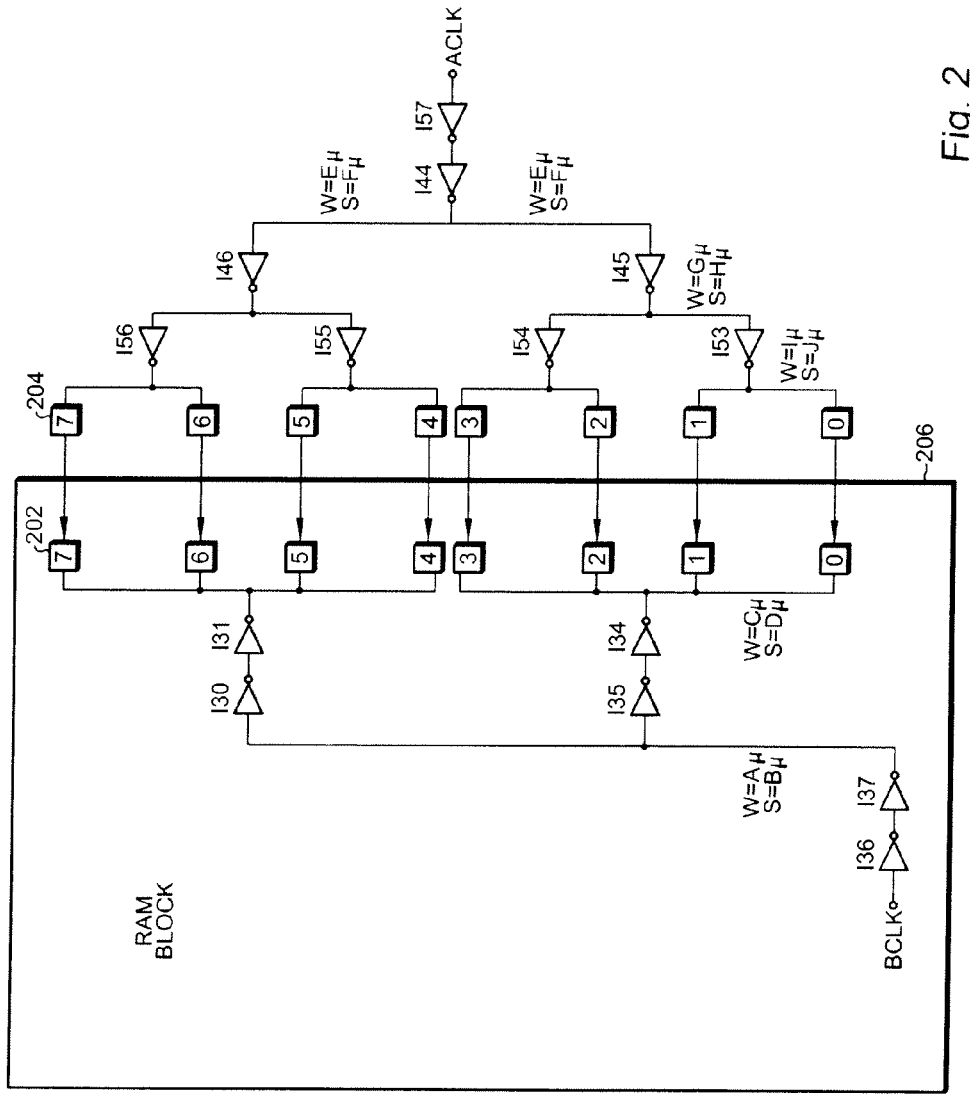
FIG. 2 is a block diagram of a prior art integrated circuit memory including mismatched input buffer and data driver clock distribution trees.
Figure 3:
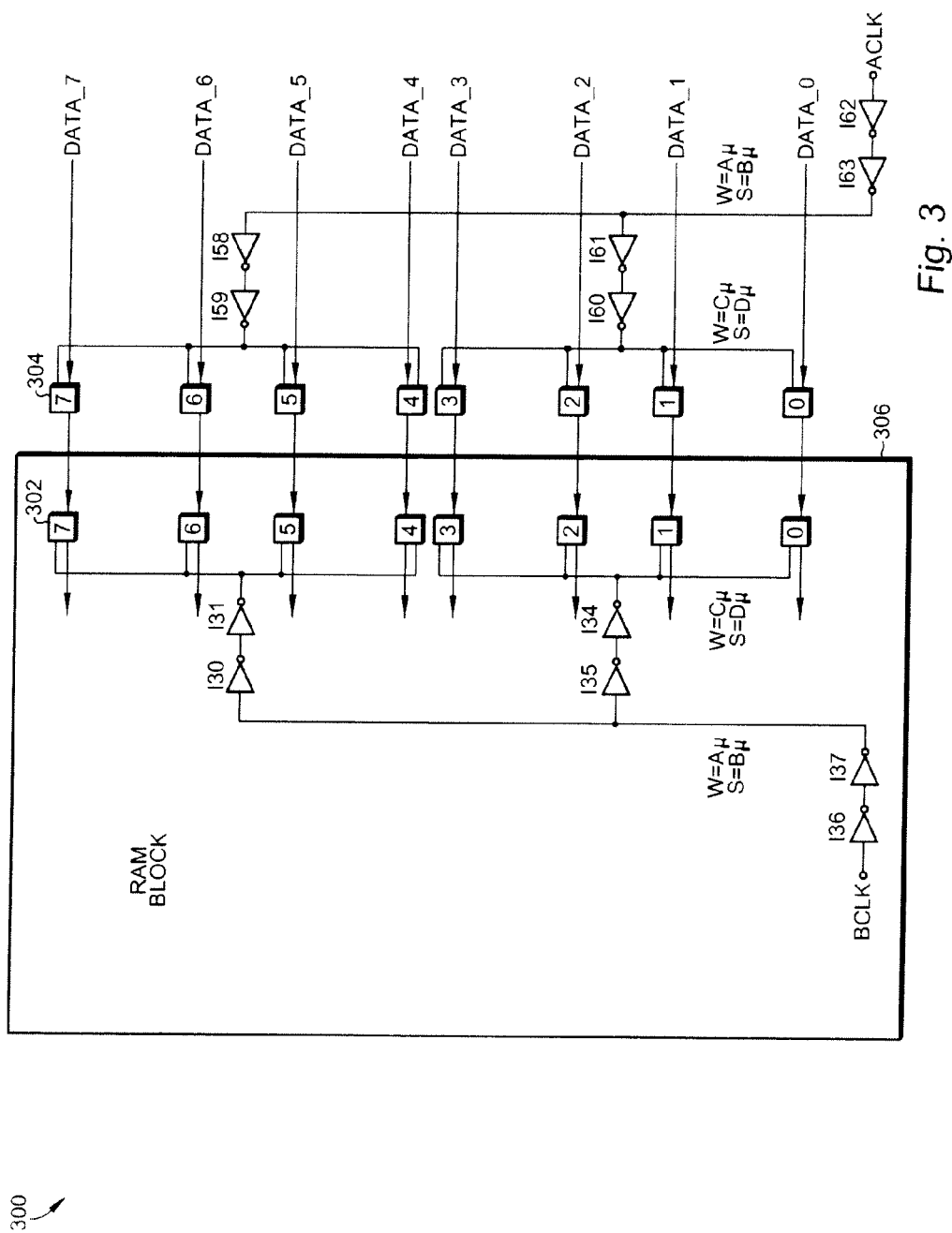
FIG. 3 is a first embodiment of a clock distribution tree circuit for an integrated circuit memory according to the present invention.

A clock distribution tree circuit is shown for a portion of an integrated circuit memory 300 in FIG. 3 according to a first embodiment of the present invention. Integrated circuit memory 300 includes input buffers 302 designated 0 through 7 resident in RAM block 306. Each input buffer has a data input, a data output, and a clock input. Integrated circuit memory 300 also includes data drivers 204 designated 0 through 7, corresponding to each of the input buffers. The clock input, data input, and the data output of the data drivers 304 are all shown in FIG. 3. The data drivers 304 are clocked by a first clock distribution tree including inverters I59-I63. Inverters I58 and I59 clock data drivers 4 through 7 and inverters I60 and I61 clock data drivers 0 through 3. In turn, inverters I62 and I63 drive inverters I58 and I61. The input buffers 302 are clocked by a second clock distribution tree mirroring the first clock distribution tree according to an aspect of the present invention including inverters I30-I31 and I34-I37. Inverters I30 and I31 clock data drivers 4-7, and inverters I34 and I35 clock data drivers 0-3. In turn, inverters I30 and I35 are driven by inverters I36 and I37. Inverter I62 receives the ACLK clock signal, and inverter I36 receives the BCLK signal. The widths W (Aµ, Cµ) and spacings S (Bµ, Dµ) of the first and second clock trees are matched for optimum performance.

By gaining specific clock tree layout information on a designed RAM block, as shown in FIG. 3, external input and output clocking can mirror any designated clock tree layout. The matching of the layout of the two clock trees as shown in FIG. 3 for line widths, loading and tree design allows for maximum data valid windows. Referring now to the schematic diagram of FIG. 3, the second clock distribution tree now has the same set up and hold times for all eight input buffers 302 labeled 0-7.

Figure 4:
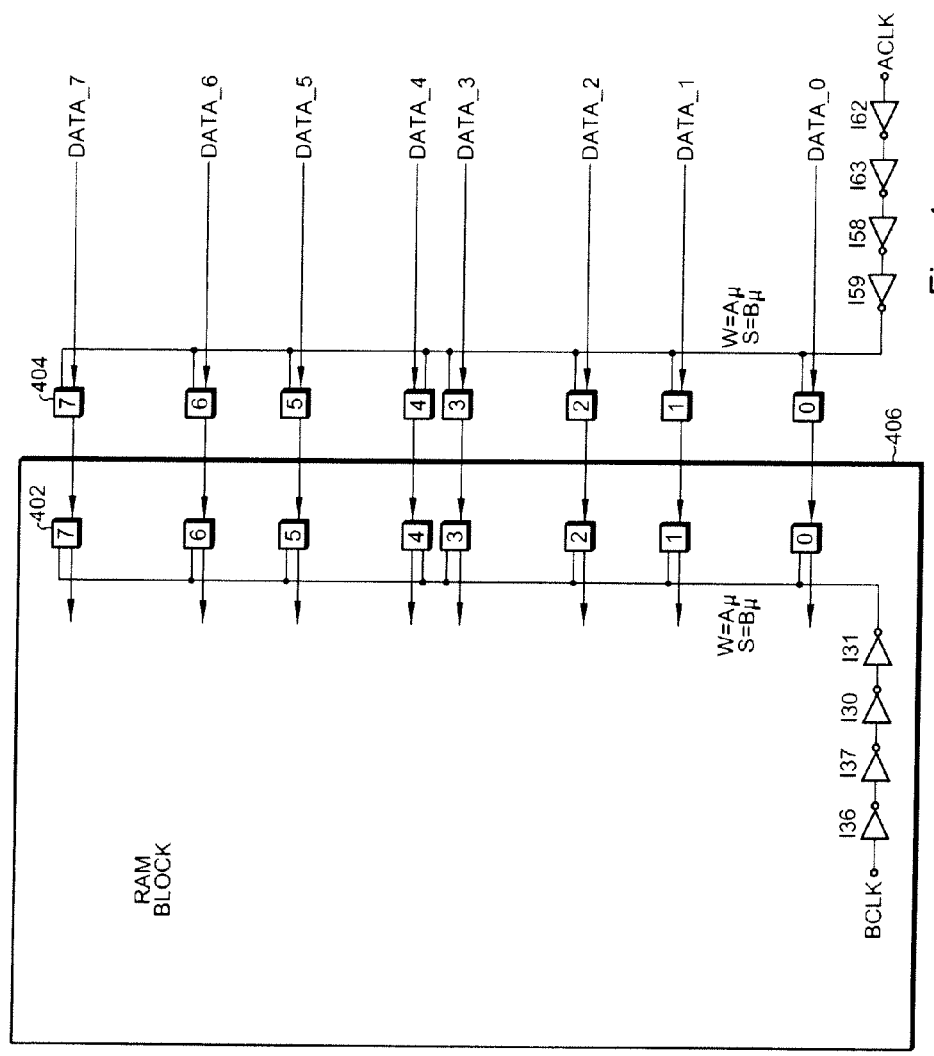
FIG. 4 is a second embodiment of a clock distribution tree circuit for an integrated circuit memory according to the present invention.

A clock distribution tree circuit is shown for a portion of an integrated circuit memory 400 in FIG. 4 according to a second embodiment of the present invention. Integrated circuit memory 400 includes input buffers 402 designated 0 through 7 resident in RAM block 406. Each input buffer has a data input, a data output, and a clock input. Integrated circuit memory 400 also includes data drivers 404 designated 0 through 7, corresponding to each of the input buffers. The clock input, data input, and the data output of the data drivers 404 are all shown in FIG. 4. The data drivers 404 are clocked by a first clock distribution tree including inverters I58-I59 and I62-I63. The input buffers 402 are clocked by a second clock distribution tree mirroring the first clock distribution tree according to an aspect of the present invention including inverters I30-I31 and I36-I37. Inverter I62 receives the ACLK clock signal, and inverter I36 receives the BCLK signal. The width W (Aµ) and spacings S (Bµ) of the first and second clock trees are matched for optimum performance.

The schematic diagram of FIG. 4 contains a high skew clock layout on the RAM block 406 side for input buffer latching. By using the techniques of the present invention and matching the clock routing for the data drivers the overall system still works at high speeds. If, however, a low skew, or what would be considered by prior art to be a better engineering, tree was used externally to the RAM block for the data drivers 404, the overall integrated memory system would fail with tight setup and hold times.

It is important to note that the term "matched" does not mean "exactly the same" as used herein. For a "matched" distribution tree all that is required is that the two distribution trees are proportionate. For example, a 50 µ load and a 5 µ driver in one distribution tree can be matched by a 20 µ load and a 2 µ driver in the other distribution tree. Persons of ordinary skill in the art will realize that the principle of the invention can be maintained by using both "exactly matched" and "proportionately matched" distribution trees.

It is also important to note that signals to be captured at the RAM block interface can include addresses and control signals in addition to data. For example, circuit blocks 402 in FIG. 4 will also include address and RAS/CAS/WE input buffers.

Figure 5:
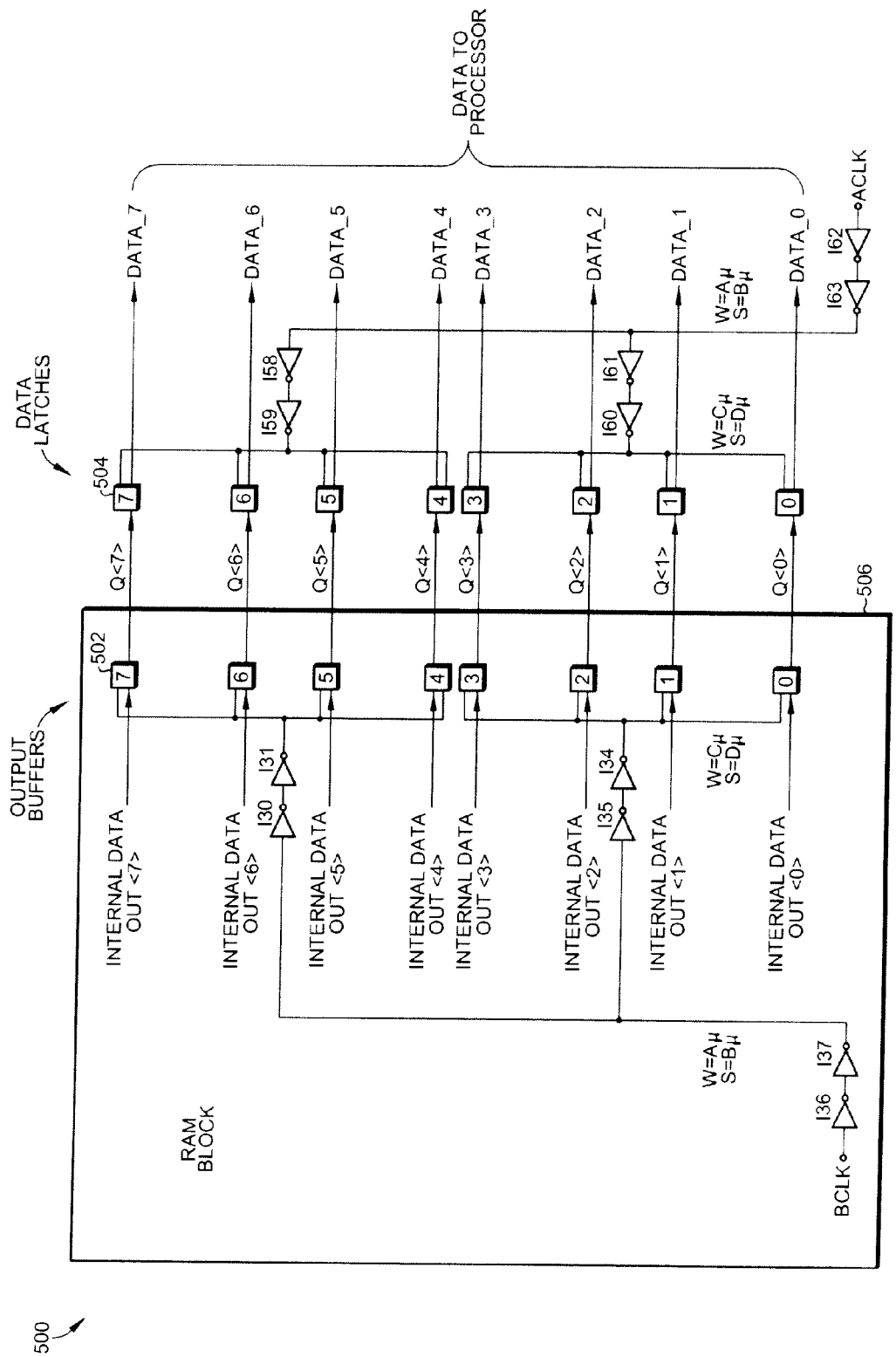
FIG. 5 is a third embodiment of a clock distribution tree circuit for an integrated circuit memory according to the present invention.

The circuit of the present invention can also work "in reverse". Blocks 402 can be data out drivers from a RAM block 406 enabled by a BCLK with a given clock tree. Blocks 404 capture this data for a processor/logic circuit with a clock ACLK with a clock tree that is matched to the one internal to the RAM. The reverse situation is shown in integrated circuit 500 of FIG. 5, including RAM block 506, output buffers 502, and data latches 504.

Figure 6:
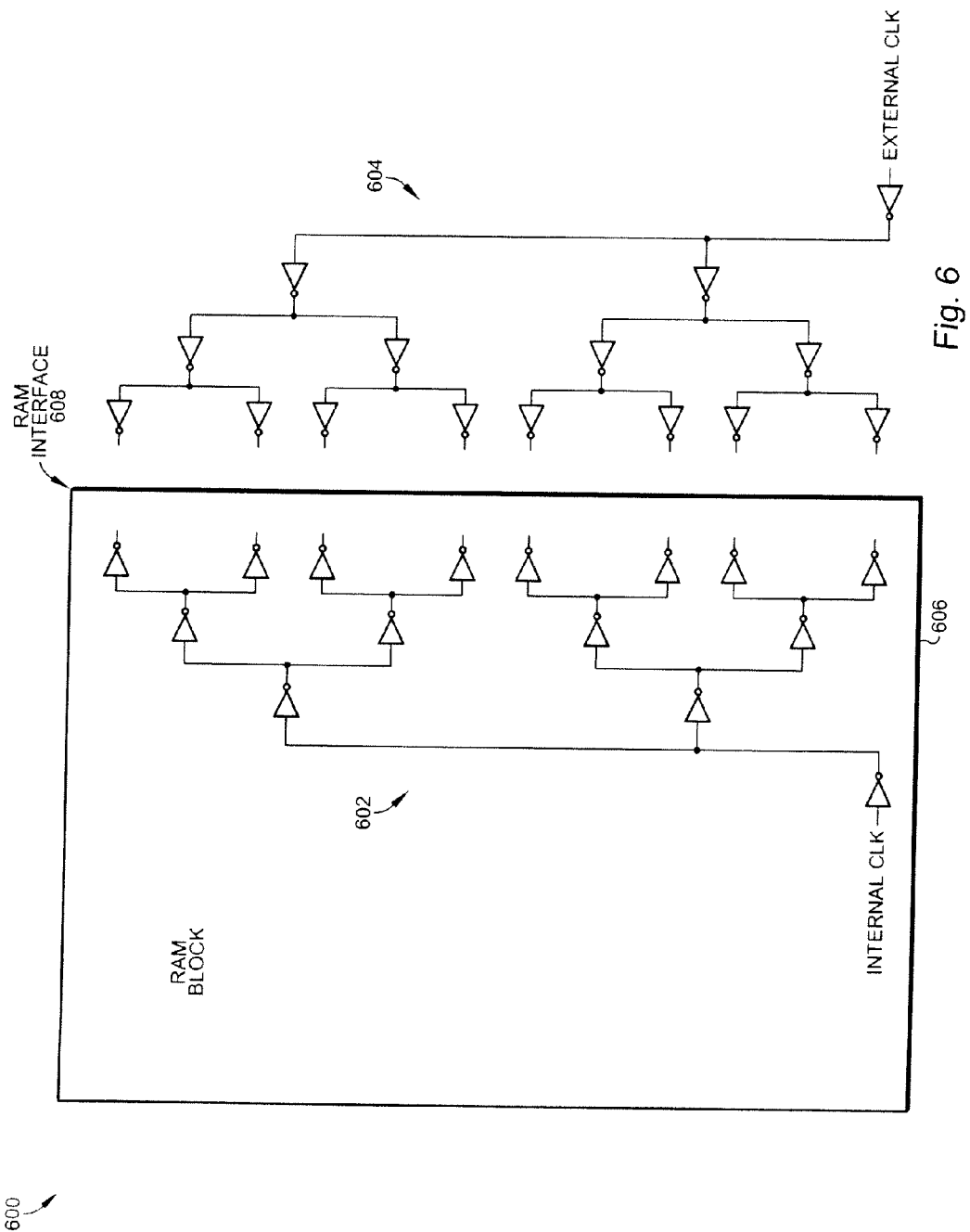
FIG. 6 is a fourth embodiment of a clock distribution tree circuit for an integrated circuit according to the present invention.

The circuit of the present invention is also not limited to the particular integrated circuit memory blocks as previously shown. The circuit of the present invention can be used in any application involving two clock distribution tree inside of an integrated circuit memory, as is shown in FIG. 6. FIG. 6 includes an integrated circuit memory having a RAM block 606, a first clock distribution tree 602 for receiving an internal CLK signal, a RAM interface 608, and a second, mirrored clock distribution tree 604 for receiving an external CLK signal, according to the principles of the present invention.

Possible applications for the clock distribution tree circuit of the present invention include, but are not limited to:

1. SoC (System On a Chip) at the RAM interface;
2. CPU with L1 cache RAM interface;
3. Circuit blocks within a RAM, for example subarray interfaces;
4. Internal/External interface for standalone commodity memories; and
5. SIP (System In a Package) at the RAM interface.

Figure 7:
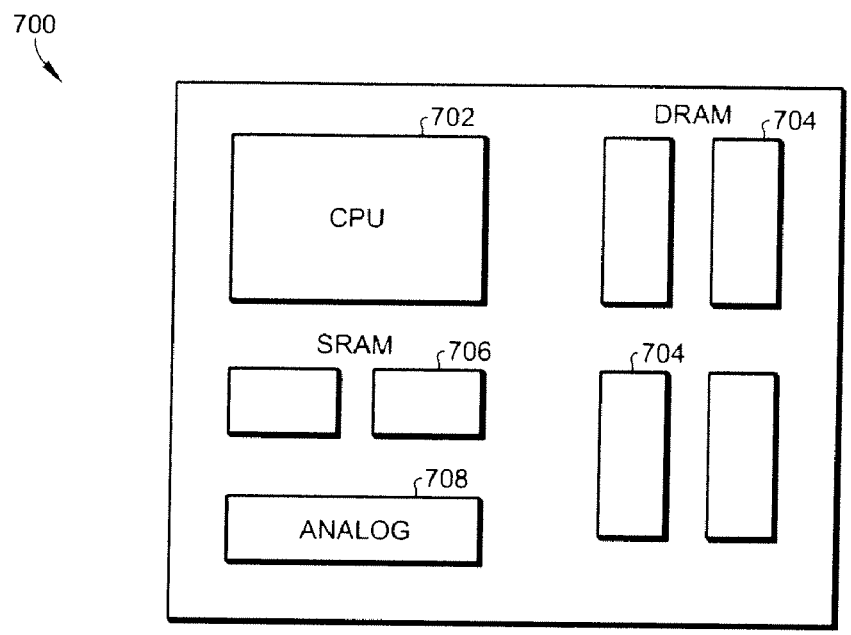
FIG. 7 is a diagram of a "system on a chip" (SoC), which is a suitable application for the clock distribution tree circuit of the present invention.

A diagram of a typical system on a chip 700 is shown in FIG. 7 including a CPU 702, a DRAM 704, an SRAM 706, and analog circuitry 708, which can be modified according to the present invention. The system blocks shown in FIG. 7 are integrated together on a single integrated circuit. Other implementations can include a stand alone commodity RAM circuit in which the blocks can be separate integrated circuit instead of all integrated together as in FIG. 7. Another implementation is a system in a package wherein DRAM and SRAM integrated circuits are stacked together on top of a CPU chip.

Figure 8:
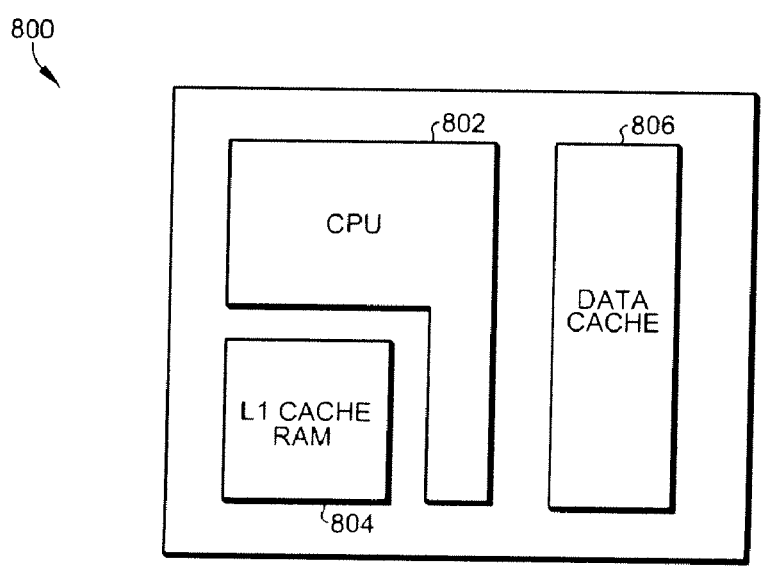
FIG. 8 is a diagram of a CPU circuit, including a data cache and an L1 cache RAM, which is another suitable application for the clock distribution tree circuit of the present invention.

A diagram of a typical CPU 800 is shown in FIG. 8 including CPU circuitry 802, an L1 cache RAM 804, and a data cache 806, which can also be modified according to the present invention.

While a "RAM BLOCK" has been shown in the drawing figures, those skilled in the art would know that other such blocks exist inside of an integrated memory circuit such as sub-array blocks, data distribution blocks, and ECC logic blocks, all of which are candidate applications for the clock distribution circuit of the present invention. The circuit of the present invention can implemented at any Internal/External interface of a standalone commodity memory.

While there have been described above the principles of the present invention in conjunction with specific logic designs and methods of operation, it is to be clearly understood that the foregoing description is made only by way of example and not as a limitation to the scope of the invention. For example, the present invention can be used in many different matched, mirrored pairings of the first and second clock distribution trees according to the present invention and then invention is not limited to the layout configurations shown in FIGS. 3 and 4. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

We claim:

1. A clock distribution tree for an integrated circuit memory comprising:
   a plurality of data drivers;
   a plurality of input buffers coupled to the plurality of data drivers;
   a first clock distribution tree coupled to the plurality of data drivers receiving a first clock signal; and
   a second clock distribution tree coupled to the plurality of input buffers receiving a second clock signal independent of the first clock signal,
   wherein the first and second clock distribution tree are substantially matched and mirrored distribution trees.

2. The clock distribution tree as in claim 1 wherein a line width of the first clock distribution tree is substantially the same as a line width of the second clock distribution tree.

3. The clock distribution tree as in claim 1 wherein a line spacing of the first clock distribution tree is substantially the same as a line spacing of the second clock distribution tree.

4. The clock distribution tree as in claim 1 wherein each of the data drivers comprises a clock input coupled to the first clock distribution tree.

5. The clock distribution tree as in claim 1 wherein each of the data drivers comprises a data input for receiving a data signal.

6. The clock distribution tree as in claim 1 wherein each of the input buffers comprises a clock input coupled to the second clock distribution tree.

7. The clock distribution tree as in claim 1 wherein each of the data drivers comprises a data output for supplying a data signal.

8. The clock distribution tree as in claim 1 wherein the plurality of input buffers is formed within a RAM block in the integrated circuit memory.

9. The clock distribution tree as in claim 1 wherein the first and second clock distribution trees each comprises:
   first and second inverters for driving a first plurality of the data drivers and the input buffers, respectively;
   third and fourth inverters for driving a second plurality of the data drivers and the input buffers, respectively; and
   fifth and sixth inverters for driving the first and third inverters.

10. The clock distribution tree as in claim 1 wherein the first and second clock distribution trees each comprise four coupled inverters for driving the plurality of data drivers and the plurality of input buffers, respectively.

11. A clock distribution method for an integrated circuit memory comprising:
    providing a plurality of data drivers;
    providing a plurality of input buffers coupled to the plurality of data drivers;
    providing a first clock distribution tree coupled to the plurality of data drivers receiving a first clock signal; and
    providing a second clock distribution tree coupled to the plurality of input buffers receiving a second clock signal independent of the first clock signal,
    wherein the first and second clock distribution tree are substantially matched and mirrored.

12. The clock distribution method as in claim 11 wherein a line width of the first clock distribution tree is made substantially the same as a line width of the second clock distribution tree.

13. The clock distribution method as in claim 11 wherein a line spacing of the first clock distribution tree is made substantially the same as a line spacing of the second clock distribution tree.

14. The clock distribution method as in claim 11 wherein a clock input of each of the data drivers is coupled to the first clock distribution tree.

15. The clock distribution method as in claim 11 wherein a data input of each of the data drivers receives a data signal.

16. The clock distribution method as in claim 11 wherein a clock input of each of the input buffers is coupled to the second clock distribution tree.

17. The clock distribution method as in claim 11 wherein a data output of each of the data drivers supplies a data signal.

18. The clock distribution method as in claim 11 further comprising forming the plurality of input buffers within a RAM block in the integrated circuit memory.

19. The clock distribution method as in claim 11 further comprising:
    driving a first plurality of the data drivers and the input buffers, respectively; and, separately,
    driving a second plurality of the data drivers and the input buffers, respectively.

20. The clock distribution method as in claim 11 further comprising driving the plurality of data drivers and the plurality of input buffers, respectively, with a plurality of coupled inverters.

* * * * *